US006480816B1

(12) United States Patent
Dhar

(10) Patent No.: US 6,480,816 B1
(45) Date of Patent: *Nov. 12, 2002

(54) CIRCUIT SIMULATION USING DYNAMIC PARTITIONING AND ON-DEMAND EVALUATION

(76) Inventor: Sanjay Dhar, 5432 Bay Creek Dr., Lake Oswego, OR (US) 97035

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/333,124

(22) Filed: Jun. 14, 1999

(51) Int. Cl.$^7$ ................................................ G06F 17/50

(52) U.S. Cl. ................................ 703/14; 703/2; 703/22; 716/4

(58) Field of Search .............................. 703/1–2, 14–22; 716/2, 4, 7

(56) References Cited

U.S. PATENT DOCUMENTS

| | | | |
|---|---|---|---|
| 5,305,229 A | 4/1994 | Dhar | 703/14 |
| 5,553,008 A | 9/1996 | Huang et al. | 703/14 |
| 6,049,662 A * | 4/2000 | Saha et al. | 703/16 |
| 6,112,022 A * | 8/2000 | Wei | 703/14 |

FOREIGN PATENT DOCUMENTS

WO   WO 98/24039   6/1998

OTHER PUBLICATIONS

Buch et al, "Symphony: A Fast Mixed Signal Simulator for BiMOS Analog/Digital Circuits", IEEE Proceedings of the Tenth International Conference on VLSI Design, pp. 403–407 (Jan. 1997).*

International Search Report for PCT/US00/11508.*

Sangiovanni–Vincentelli, A., "Circuit Simulation," in Computer Design Aids for VLSI Circuits, P. Antognetti, D.O. Pederson, and H. De Man, Eds. Groningen, The Netherlands: Sijthoff and Noordhoff, 1981, pp. 19–113.

Huang, C.X., et al., "The Design and Implementation of Powermill," Proceedings of the International Symposium on Low Power Design, pp. 105–120, 1995.

Devgan, A., "Transient Simulation of Integrated Circuits in the Charge–Voltage Plane," IEEE Transactions on Computer–Aided Design of Integrated Circuits and Systems, vol. 15, No. 11, Nov. 1996, pp. 1379–1390.

Ho, C.W., et al., "The Modified Nodal Approach to Network Analysis," IEEE Transactions on Circuits and Systems, vol. CAS–22, No. 6, Jun. 1975, pp. 504–509.

Hopcroft, J.E., "Dividing a Graph into Triconnected Components," SIAM Journal on Computing, vol. 2, No. 3, Sep. 1973, pp. 135–158.

(List continued on next page.)

*Primary Examiner*—Kevin J. Teska
*Assistant Examiner*—Samuel Broda
(74) *Attorney, Agent, or Firm*—Columbia IP Law Group, PC

(57) ABSTRACT

An EDA tool is provided with a circuit simulator that simulates circuit operation using dynamic partitioning and on-demand evaluation. The circuit simulator includes a static partitioner, a dynamic partitioner and an evaluation scheduler. The static partitioner pre-forms a number of static partitions for the circuit. During simulation, the dynamic partitioner forms and re-forms a number of dynamic partitions referencing the static partitions. At each simulation time step, the evaluation scheduler determines which, if any, of the dynamic partitions have to be evaluated, and evaluating on-demand only those where evaluations are necessary. In one embodiment, when evaluations are performed, they are performed through matrix solution when accuracy is needed.

26 Claims, 15 Drawing Sheets-

OTHER PUBLICATIONS

Newton, A.R., et al., "Relaxation–Based Electrical Simulation," IEEE Transactions on Computer–Aided Design, vol. CAD–3, No. 4, Oct. 1984, pp. 308–331.

Shih, Y.H., et al., "Illiads: A New Fast MOS Timing Simulator Using Direct Equation–Solving Approach," Proceedings of the 28th ACM/IEEE Design Automation Conference, Jun. 1991, pp. 20–25.

Tarjan, R., "Depth–First Search and Linear Graph Algorithms," SIAM Journal on Computing, vol. 1, No. 2, Jun. 1972, pp. 146–160.

Ackland, B. D., et al., "Event–EMU: An Event Driven Timing Simulator for MOS VLSI Circuits," International Conference on Computer Aided Design, US, Los Alamitos, IEEE Comps. Soc. Press, vol. Conf. 7, Nov. 5, 1989, pp. 80–83.

Adler, D., "Switch–Level Simulation Using dynamic Graph Algorithms," IEEE Transactions on Computer–Aided Design of Integrated Circuits and Systems, Mar. 1991, USA, vol. 10, No. 3, pp. 346–355.

Payer, M., "Partitioning and Ordering of CMOS Circuits for Switch Level Analysis," Integration, The VLSI Journal, NL, North–Holland Publishing Company, Amsterdam, vol. 10, No. 2, 1991, pp. 113–141.

Simic, N., et al., "Partitioning Strategies Within a Distributed Multilevel Logic Simulator Including Dynamic Repartitioniing," Proceedings Euro–DAC '93, European Design Automation Conference with Euro–VHDL '93, Proceedings of Euro–DAC 93 and Euro–VHDL 93—European Design Automation Conference, Hamburg, Germany, Sep. 20–24, 1993, pp. 96–101.

Yu, Meng–Lin et al., "VLSI Timing Simulation with Selective Dynamic Regionization," Proceedings 27th Annual Simulation Syposium, 27th Annual Simulation Symposium, La Jolla, CA, USA, Apr. 11–15, 1994, IEEE Comput. Soc. Press, Los Alamitos, CA, USA, pp. 208–216.

* cited by examiner

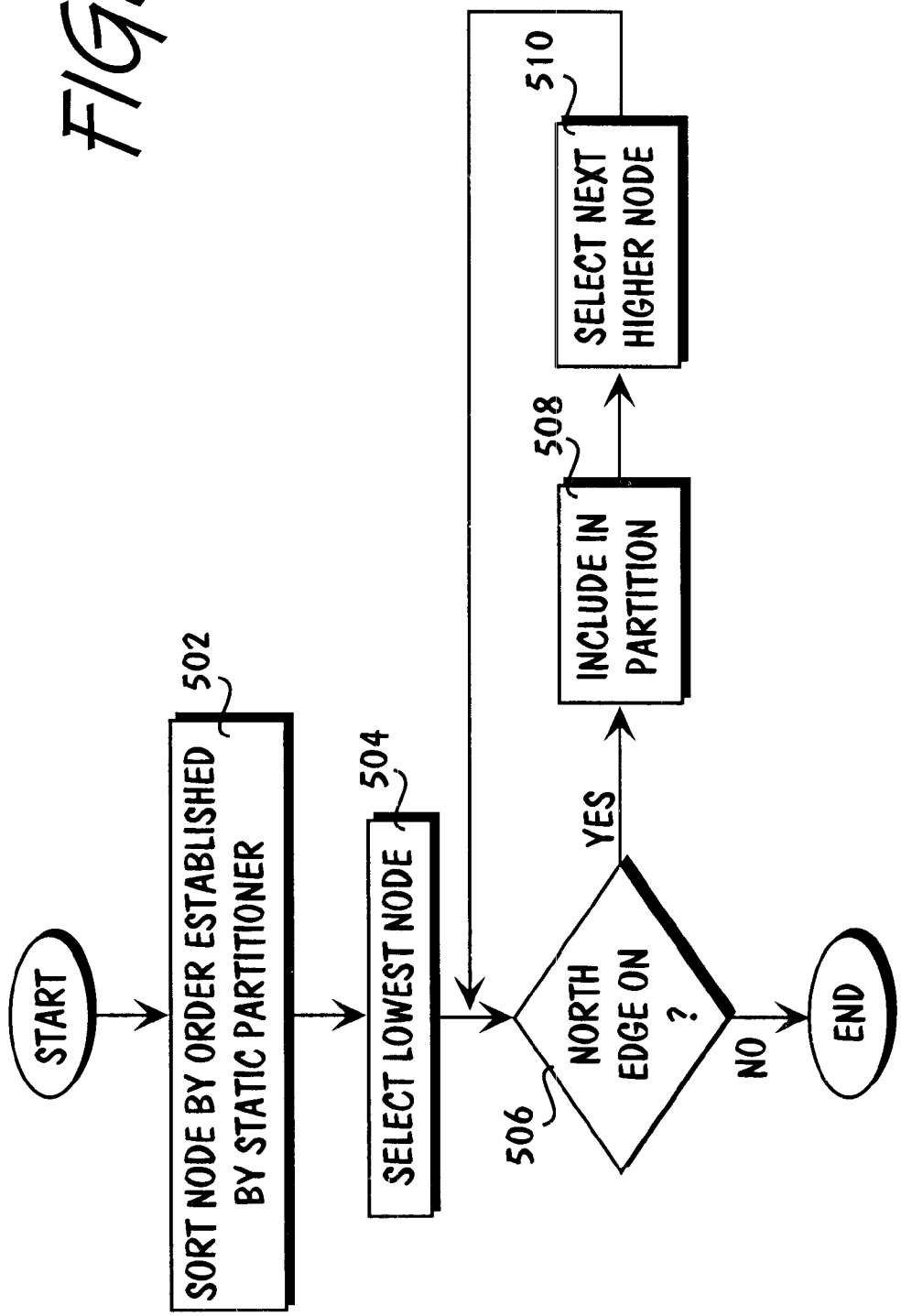

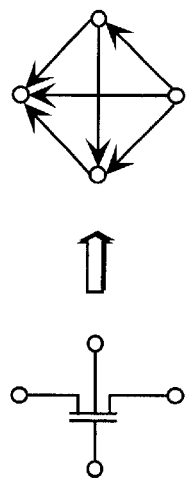
FIG. 11b ACCURATE MOS TRANSISTOR GRAPH MODEL
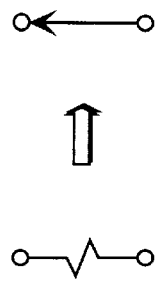
FIG. 11a RESISTOR GRAPH MODEL
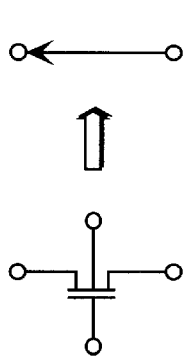
FIG. 11a FAST MOS TRANSISTOR GRAPH MODEL
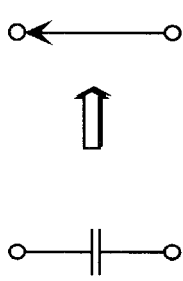
FIG. 11c CAPACITOR GRAPH MODEL

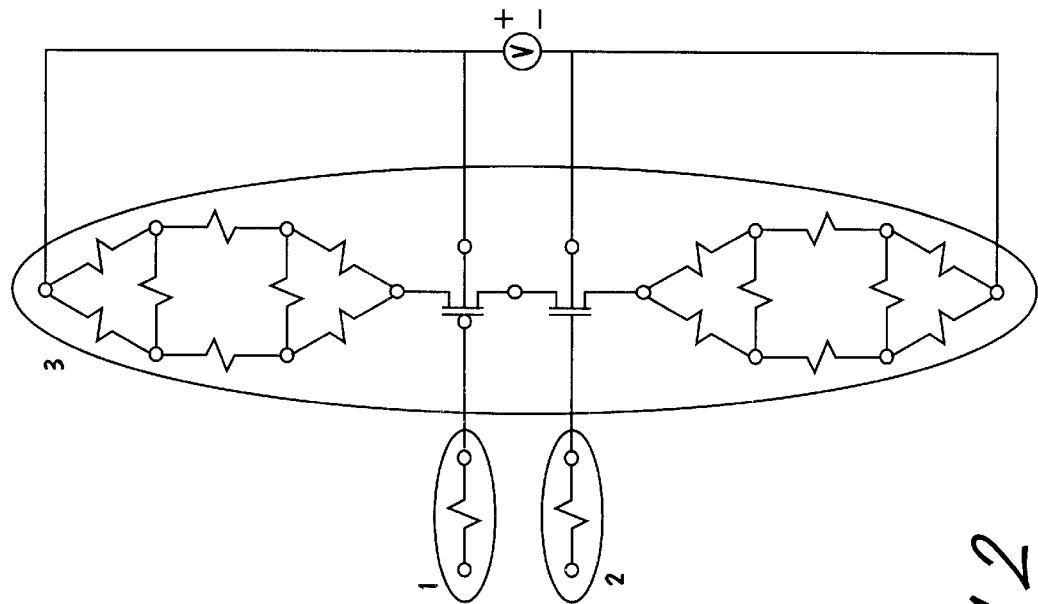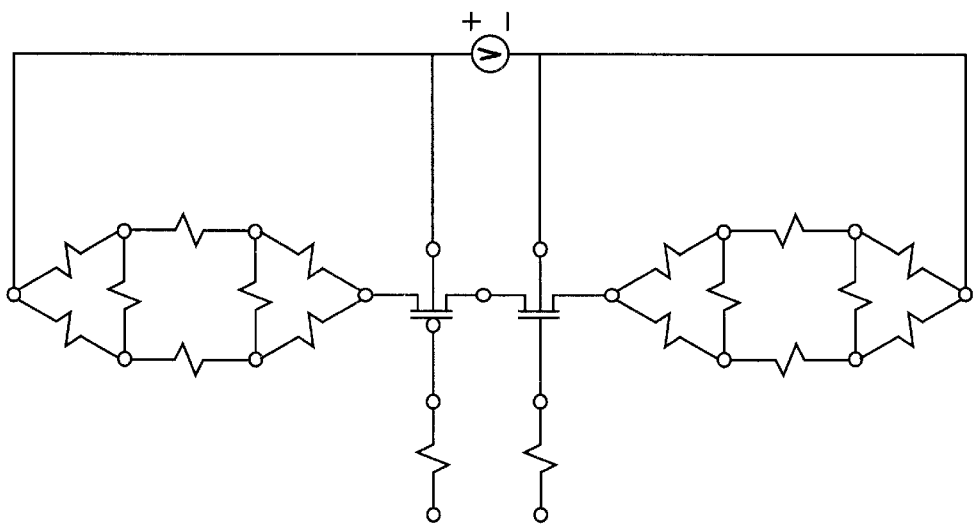
FIG. 12

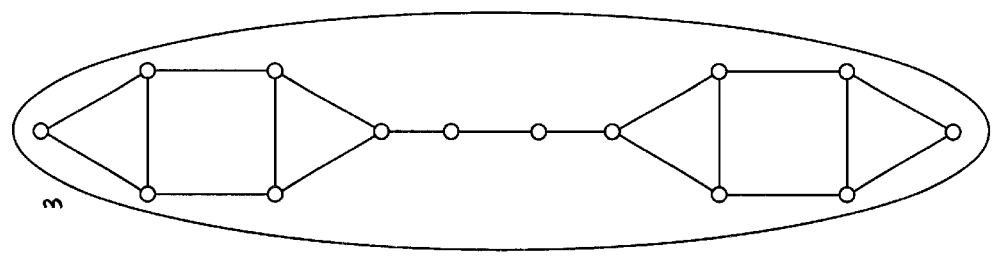
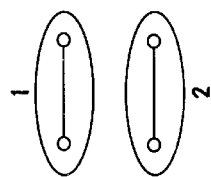
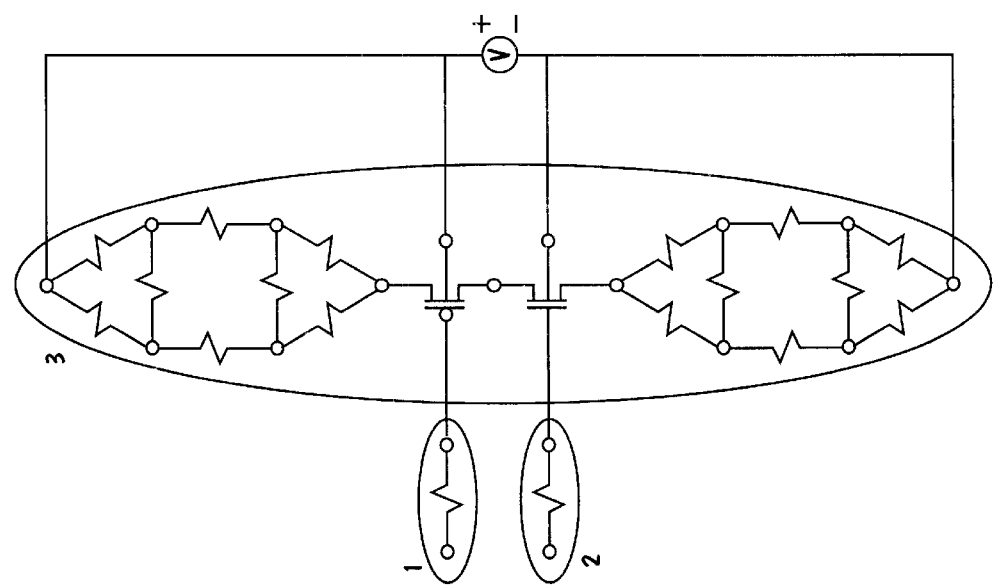
FIG. 13

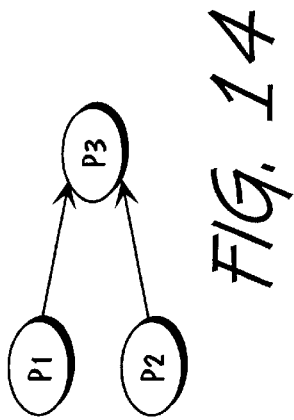
FIG. 14
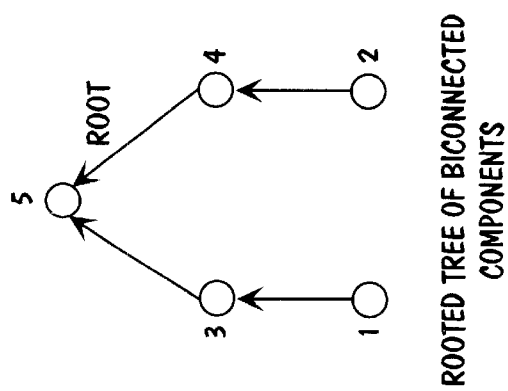
ROOTED TREE OF BICONNECTED COMPONENTS
FIG. 15
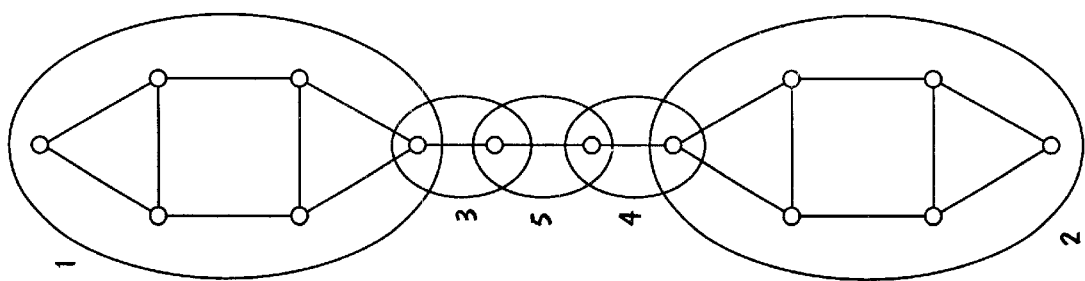

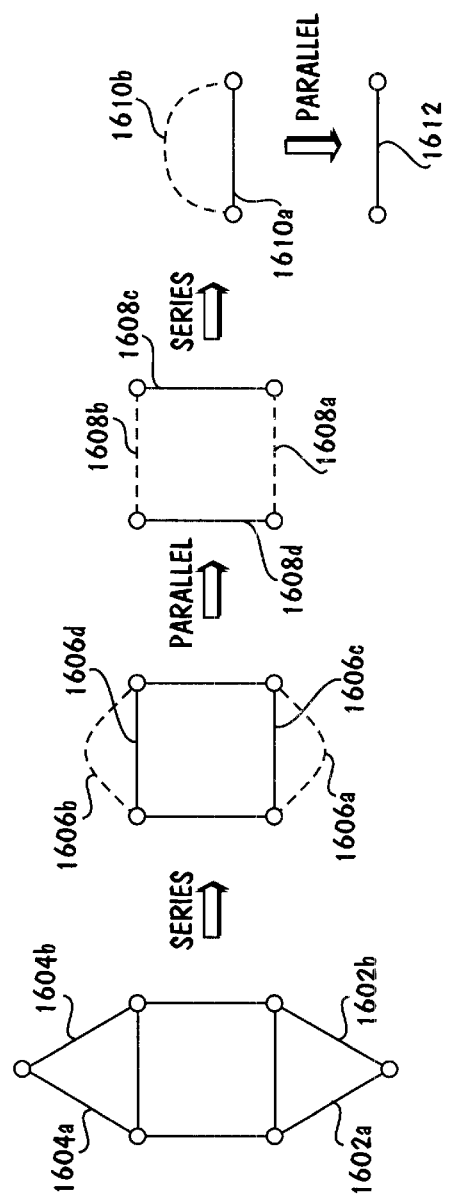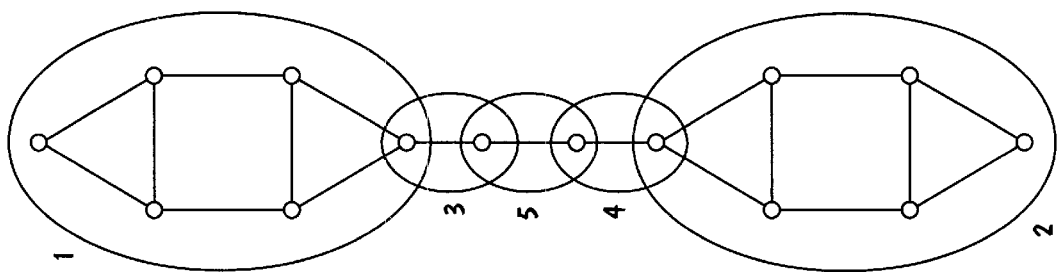
FIG. 16

N-TYPE MOS TRANSISTOR

P-TYPE MOS TRANSISTOR

ALWAYS ON
CAPACITOR

ALWAYS ON
RESISTOR GRAPH MODEL

CIRCUIT SIMULATION USING DYNAMIC PARTITIONING AND ON-DEMAND EVALUATION

BACKGROUND OF THE INVENTION

1. Field of the Invention

The present invention relates to the field of integrated circuit (IC) design. More specifically, the present invention relates to circuit simulation.

2. Background Information

Circuit simulation involves taking a description of a circuit, usually called a netlist, and a description of the input stimulus and then solving certain mathematical equations to determine the response of the circuit to the given input stimulus over the simulation time period. An example of a circuit simulator is the SPICE simulator, originally developed by W. Nagel. See e.g. W. Nagel, "SPICE2, A computer program to simulate semiconductor circuits", University of California, Berkeley, Memo No. ERL-M520, May 1975. Circuit simulators like SPICE represent a circuit as a set of coupled first order non-linear differential equations. Well-known techniques like Modified Nodal Analysis are used to perform this mathematical representation. The set of coupled non-linear equations are then solved using a sequence of steps, as illustrated in FIG. 10. The steps involve determining the time-step of integration, linearising the differential equations, and solving the resulting set of linear algebraic equations. A test is performed to determine if convergence has been achieved. The process is repeated till convergence is reached. Once convergence has been achieved, time is advanced and the entire process is repeated.

This traditional method of circuit simulation has a time complexity of $O(N^3)$ in the worst case, and $O(N^{1.5})$ in the average case. This is due to the step involving the solution of the linear algebraic equations. This solution requires solving a matrix which has the time complexity of $O(N^3)$. Due to this super-linear time complexity of the algorithm in circuit simulators like SPICE, they are incapable of solving large circuits. Usually the limits of such simulators are reached when circuit sizes reach 100,000 devices. Solving circuits larger than this size becomes impossible, since the time taken to find the solution becomes very large.

The need to solve large circuits is becoming ever more important due to the advances of silicon process technology. Integrated circuits or chips with multi-million transistors are quite common. In order to address this need, alternative algorithms have been developed. For example, algorithms developed by C. X Huang etc, as disclosed in C. X. Huang et al., "The design and implementation of Powermill", Proceedings of the International Symposium on Low Power Design, pp. 105–120, 1995, by Y.-H. Shih etc as disclosed in Y. H. Shin et al., "ILLIADS: A new Fast MOS Timing Simulator Using Direct Equation Solving Approacg" Proceedings of 28$^{th}$ ACM/IEEE Design Automation Conference, 1991, and by A. Devgan as disclosed in A. Devgan, "Transient Simulation of Integrated Circuits in the Charge-Voltage Plane", IEEE Transactions on Computer-Aided Design of Integrated Circuits and Systems, VI. 15, No. 11, November 1996. These algorithms are characterized by a linear $O(N)$ time complexity, thereby allowing them to handle large circuits.

The linear time complexity in these algorithms is achieved by partitioning the circuit into small partitions. To avoid the super-linear time of matrix solution, these algorithms use an approximate (i.e. inaccurate) solution instead. Under Huang's approach, an algorithm called one-step relaxation is used. This algorithm often has inaccuracies of up to 20% and has serious problems on stiff circuits. In common circuits, relaxation based algorithms do not obtain the correct results. Circuits characterized by tight feedback or coupling cause problems for this algorithms. Under Shih's approach, a direct equation solving technique is used. This works well in very limited situations where the device models can be accurately modeled by the second-order Shichman and Hodges model. This is rarely true with the latest silicon process technologies that require the very complex and highly non-linear BSIM3 models for accurate device models. Devgan uses an explicit integration technique but as evidenced from the waveforms in this paper, the accuracy is inadequate. The common problem with using any approximate algorithm for solving the matrix equations is that accuracy is usually not consistently good for all circuit design styles, especially for stiff circuits.

Standard matrix based algorithms do not suffer from the inaccuracy of relaxation and other approximate algorithms. Using matrix based algorithms along with partitioning can result in good accuracy; only the nodes at the boundaries of partitions can have degraded accuracy. However, use of single time-step for all partitions produces significantly reduced performance.

Thus, an improved approach to circuit simulation is desired.

SUMMARY OF THE INVENTION

An EDA tool is provided with a circuit simulator that simulates circuit operation using dynamic partitioning and on-demand evaluation. The circuit simulator includes a static partitioner, a dynamic partitioner and an evaluation scheduler. The static partitioner pre-forms a number of static partitions for the circuit. During simulation, the dynamic partitioner forms and re-forms a number of dynamic partitions, referencing the static partitions. At each simulation time step, the evaluation scheduler determines which, if any, of the dynamic partitions have to be evaluated, and evaluating on-demand only those where evaluations are necessary.

In one embodiment, the static partitioner forms the static partitions by organizing devices of the IC design into connected sets. The static partitioner also pre-processes the static partitions into a form tailored to the dynamic partitioner's needs. In one embodiment, the dynamic partitioner determines if the devices of the IC design are in an On or an Off state, and forms the dynamic partitions accordingly. In one embodiment, the evaluation scheduler determines whether any of the dynamic partitions are in steady state, and schedules the dynamic partitions for evaluation accordingly. In one embodiment, the evaluations, when performed, are performed through matrix solution when accuracy is needed.

BRIEF DESCRIPTION OF DRAWINGS

The present invention will be described by way of exemplary embodiments, but not limitations, illustrated in the accompanying drawings in which like references denote similar elements, and in which:

FIGS. 5 and 6a–6b illustrate the operation flow of three aspects of the dynamic partitioner of FIG. 1, in accordance with one embodiment;

FIGS. 11a–11b illustrate four example graphical representations of devices;

FIG. 12 illustrates an example static partition of an IC design;

FIG. 13 illustrates example graphical representations of the static partitions;

FIG. 14 illustrates an example signal flow representation of the partitioned IC design;

FIG. 15 illustrates an example graphical representation of biconnected components;

FIG. 16 illustrates an example serial parallel reduction operation;

DETAILED DESCRIPTION OF THE INVENTION

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as netlist, graphical representations, nodes, and so forth. Also, parts of the description will also be presented in terms of operations performed by a computer system, using terms such as traversing, generating, determining, and the like. As well understood by those skilled in the art, these quantities or operations take the form of electrical, magnetic, or optical signals being stored, transferred, combined, and otherwise manipulated through electrical, magnetic and optical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 1:
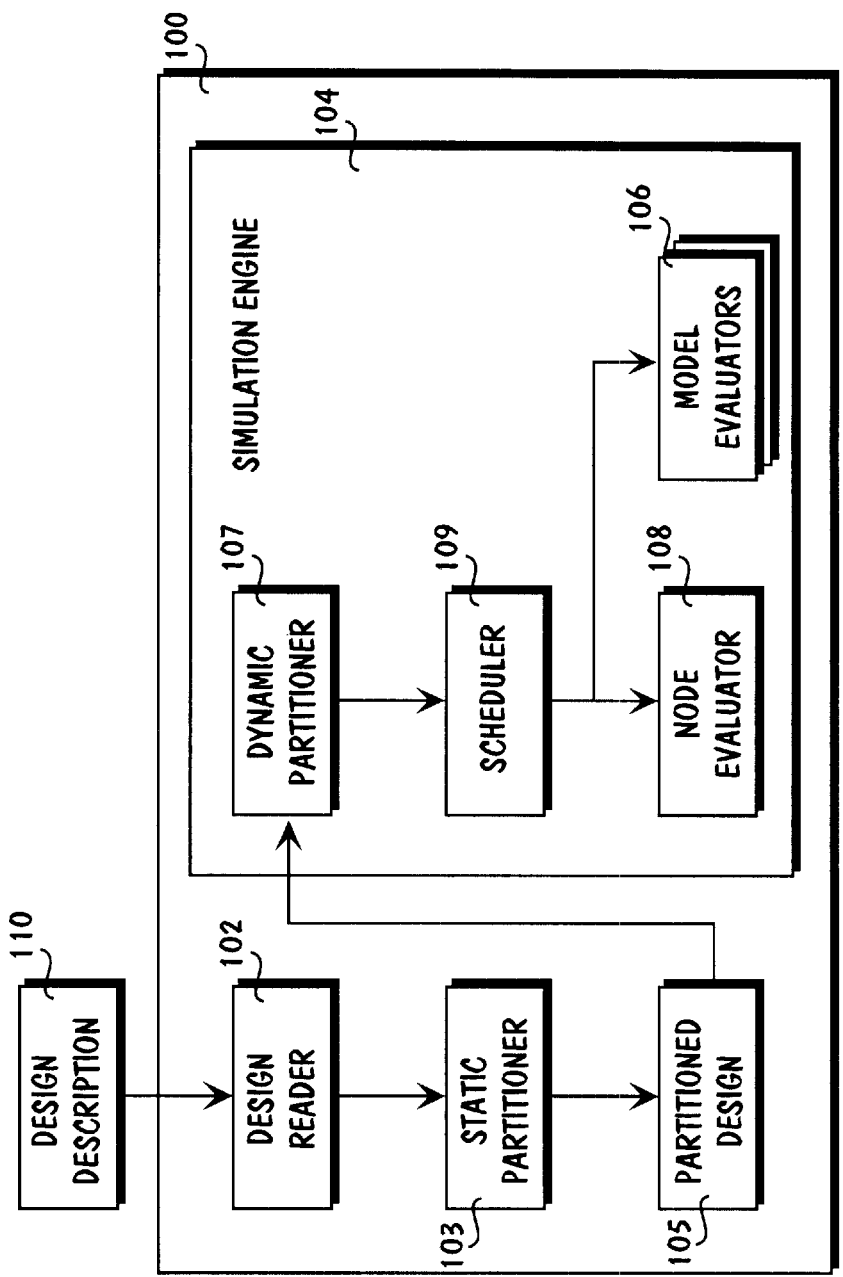
FIG. 1 illustrates an overview of the present invention in accordance with one embodiment.

Referring now to FIG. 1, wherein a block diagram illustrating an overview of the present invention in accordance with one embodiment is shown. As illustrated, IC design simulation tool 100 of the present invention is constituted with design reader 102, static partitioner 103 and simulation engine 104 comprising dynamic partitioner 107, scheduler 109, node evaluator 108 and model evaluators 106. The elements are operatively coupled to each other as shown. As will be described in more detail below, static partitioner 103, dynamic partitioner 107 and scheduler 109 are incorporated with the teachings of the present invention. Certain aspects of design reader 102 and model evaluators 106 are the subject of co-pending U.S. patent application, Ser. No. 09/333,122, contemporaneously filed and entitled Adaptive Integrated Circuit Design Simulation Transistor Modeling And Evaluation, which is hereby fully incorporated by reference.

As in the prior art, design reader 102 is used to read design description 110 provided by a designer. Design description 110 includes connectivity information connecting various models modeling electronic devices in the IC design. In one embodiment, in addition to flattening a hierarchical design, design reader 102 also assigns device characterizations to selected ones of the electronic devices of the IC design. Static partitioner 103 pre-compiles or pre-partitions the IC design into static partitions as well as pre-processes the static partitions into a form particularly suitable for the dynamic partitioner 107. During simulation, dynamic partitioner 107 further forms and re-forms dynamic partitions of the IC design that are relevant, referencing the pre-formed static partitions. Scheduler 109 determines whether evaluations are necessary for the dynamic partitions for the particular simulation time step, and schedules the dynamic partitions for evaluation on an as-needed or on-demand basis. Accordingly, node evaluator 108 and model evaluators 106 are selectively invoked on an as needed or on-demand basis to evaluate the states of the connections connecting the models, and various parameter values of the models, such as current, voltage and so forth, respectively. In one embodiment, at least one of the model evaluators adaptively performs the model evaluations at different accuracy or performance levels in accordance with the assigned device characterizations of the devices. Where accuracy is needed, the evaluations are performed through matrix solution.

Device characterization and employment of such device characterizations to adaptively perform model evaluation is explained in the above identified incorporated by reference co-pending U.S. patent application. Static partitioner 103, dynamic partitioner 107 and scheduler 109 will be describe in more detail below in turn. As those skilled in the art will appreciate from the description to follow, the present invention advantageously allows accuracy to be achieved where needed, but otherwise, performance to be achieved where accuracy is unnecessary. As a result, the present invention achieves an overall level of performance and accuracy that is superior to that of the prior art approaches.

Figure 2:
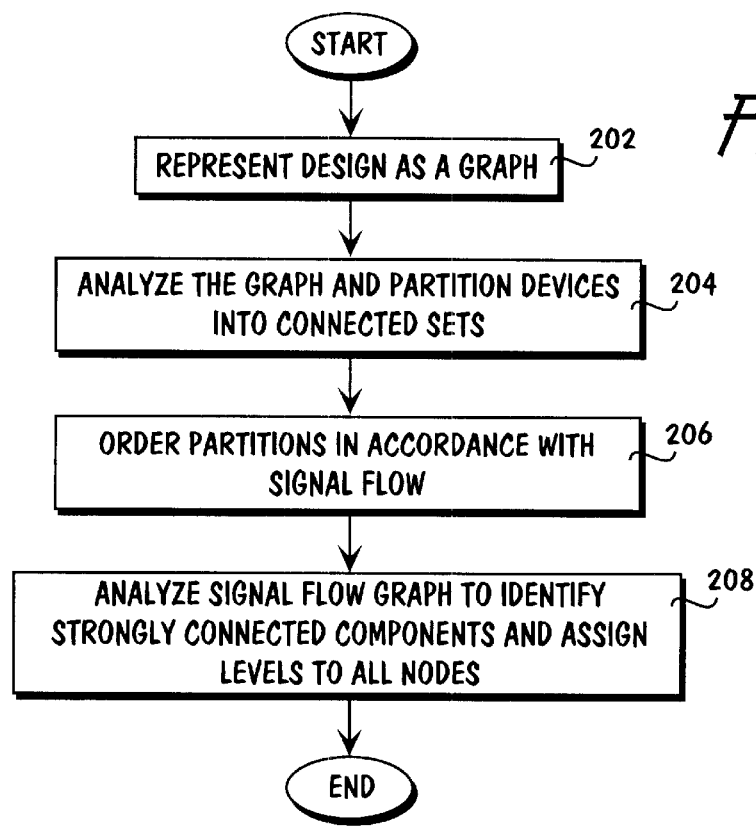
FIGS. 2–3 illustrate the operation flow of two aspects of the static partitioner of FIG. 1, in accordance with one embodiment each.
Figure 3:
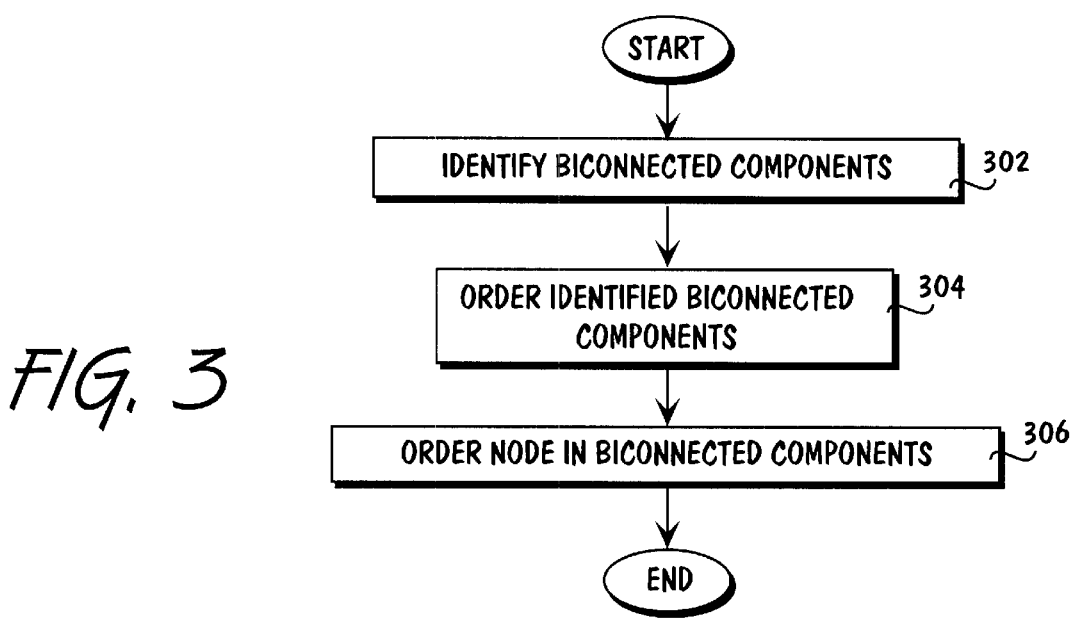

Referring now to FIGS. 2–3, wherein two block diagrams illustrating the operational flow for two aspects of the static partitioner of FIG. 1 are shown. As illustrated, at 202, static partitioner 103 first represents the design as a graph. In the graph representation, the primitive devices (or elements) are each represented by a graph model, and the connectivity of the primitive devices (hereinafter simply devices) is represented via the connectivity of the graph models. (FIGS. 11a–11d illustrate how four example devices can be graphically represented. Other devices may be similarly represented.) Then, at 204, static partitioner 103 analyzes the graph and partitions the devices into connected sets. Starting at each node in the graph, static partitioner 103 traverses every edge connected to that node, and brings the node connected to the opposite side of that edge into the connected set of this node. Once all the edges have been traversed, static partitioner 103 performs the operation on the next node. The process is repeated until all nodes have been operated on. At such time, a number of connected sets or static partitions have been formed. (FIGS. 12–13 illustrate an example application of this process to an example IC design, partitioning the IC design into three static partitions, with each static partition having its own graph representation.)

For the illustrated embodiment, upon partitioning an IC design into a number of static partitions, static partitioner 103 further orders the static partitions in accordance with signal flow, 206. Signal flow ordering is accomplished by first creating a directed graph (see FIG. 14). In this directed graph, a node represents a static partition. A directed edge from $node_1$ to $node_2$ represents the flow of a signal from $node_1$ to $node_2$.

Next, at 208, static partitioner 103 analyzes the signal flow graph for strongly connected components to "levelize" the static partitions. Identification of strongly connect components may be accomplished using any one of a number of known techniques, e.g. the strongly connected component algorithm disclosed by Tarjan, "Depth-First Search and Linear Graph Algorithms", SIAM Journal on Computing, Vol. 1, No. 2, June 1972. All nodes (i.e. partitions) in the same strongly connected component are considered to be in the same level. Each node (i.e. partition) is assigned a level. The nodes (i.e. partitions) with no edge incident on them get the smallest level assignment, level 0. For a node (i.e. partition) at level n, static partitioner 103 traverses all edges going out this node (i.e. partition) and assigns a level n+1 to the node (i.e. partition) across the edge. Once all nodes (i.e. partitions) at level n have been processed, static partitioner 103 proceeds to nodes i.e. partitions) at level n+1, until all nodes (i.e. partitions) have been processed. Thus, through the levelization process, the signals are ensured to flow from partitions assigned with the lower numbers to partitions assigned with the higher numbers.

Additionally, for the illustrated embodiment, static partitioner 103 also keeps partitions that form a loop from being assigned the same level number. At an arbitrary point, static partitioner 103 increases the level number assignment.

Next, static partitioner 103 analyzes and pre-processes the structure of each static partition into a form that is particularly suitable for dynamic partitioner 107 to form dynamic partitions during simulation, thereby making it possible for simulation engine 104 to realize even greater performance improvements. More specifically, for each static partition, static partitioner 103 establishes an order for the nodes and edges of the graph representation of the static partition. As illustrated in FIG. 3, the order establishment process for each static partition is a three-step process. At 302, static partitioner 103 traverses the graph representation in a depth-first manner to identify the biconnected components. At 304, static partitioner 103 orders the biconnected components into a tree structure (see FIG. 15). Once a root is chosen, all other biconnected components can be ordered based on their tree connection. For the illustrated embodiment, static partitioner 103 selects the biconnected component with the largest number of nodes as the root.

At 306, static partitioner 103 orders the nodes within each of the biconnected components. For the illustrated embodiments, static partitioner 103 classifies biconnected components into three types. Type I is a biconnected component with a single edge. Type II is a biconnected component with multiple edges, however the nodes are connected in such a way that the biconnected component can be separated into two unconnected parts by removing exactly two edges. This type of graph is more commonly called two-connected or series-parallel. Type III is a biconnected component that cannot be classified as either Type I or Type II.

In general, the ordering operation involves ordering the nodes and from the node, the edges are ordered. The nodes are ordered from small to large. An edge is always connected between two nodes. The south node of an edge is always of lower order than the north edge.

For each Type I biconnected component, the node closer to the root gets a higher order than the other node. The edge is therefore arranged such that the higher order node is the north node and the lower order node is the south node.

For each Type II biconnected component, a series and parallel reduction process is performed. The process reduces a Type II biconnected component into a Type I biconnected component. The newly formed Type I biconnected component is then ordered as described earlier. Once the reduced biconnected component is ordered as a Type I biconnected component, the series and parallel reduction process is reversed, unfolding the reduced nodes and edges, which are then ordered as they are unfolded.

Skipping briefly to FIG. 16, an example application of the serial and parallel reduction process is illustrated. The illustration applies to biconnected component 5 as well as biconnected component 1 (both are Type II, per above definition). As illustrated, serially connected edge pairs 1602a and 1602b, and 1604a and 1604b, can be replaced by edges 1606a and 1606b respectively. Then, parallel edge pairs 1606a and 1606c, and 1606b and 1606d, can be replaced by edges 1608a and 1608b respectively. Likewise, serially connected edge pairs 1608a and 1608c, and 1608b and 1608d, can be replaced by edges 1610a and 1610b respectively. Finally, parallel edge pair 1610a and 1610b can be replaced by edge 1612. The reversal process is exactly the opposite.

Returning now to FIG. 3, more specifically, the performance of operation 306 for Type III biconnected components, for each Type III biconnected component, all nodes are collected and sorted based on the number of edges connected to the node. The number of edges connected to the node is referred to as the node degree. Then, among the sorted nodes (or the remaining ones, in subsequent passes), static partitioner 103 selects a node with the smallest node degree, visits all unordered edges of the node, and makes the selected node the south node of these edges. Once the selected node has been made the south node of these edges, the edges are considered ordered, and marked accordingly. Next, the node degrees of the north nodes of these edges are all reduced by 1. Furthermore, fill-edges are inserted for the selected node. The process is then repeated for the next node with the smallest node degree. The repetition continues until all nodes have been processed.

Fill-edges are inserted to complete the node and edges ordering such that the matrix solution operation can be performed on the static partition during simulation (when evaluation is needed). Fill-edges represent the same function as fill-ins in matrix computation. By determining all the fill-edges prior to simulation, the amount of computations required during evaluation is advantageously reduced, thereby improving performance. Fill-edges of a node n1 is determined by looking at the north edges of the node n1. For each north edge with north node m1, the north node m2 of each following north edge is examined. If there is no edge connecting nodes m1 and m2, a fill-edge is added between these two nodes, with node m1 as the south node, and node m2 as the north node. The node degree of nodes m1 and m2 are each increased by 1. The fill-edge insertion process is itself also incrementally repeated until all north edges of node n1 have been processed.

Figure 4:
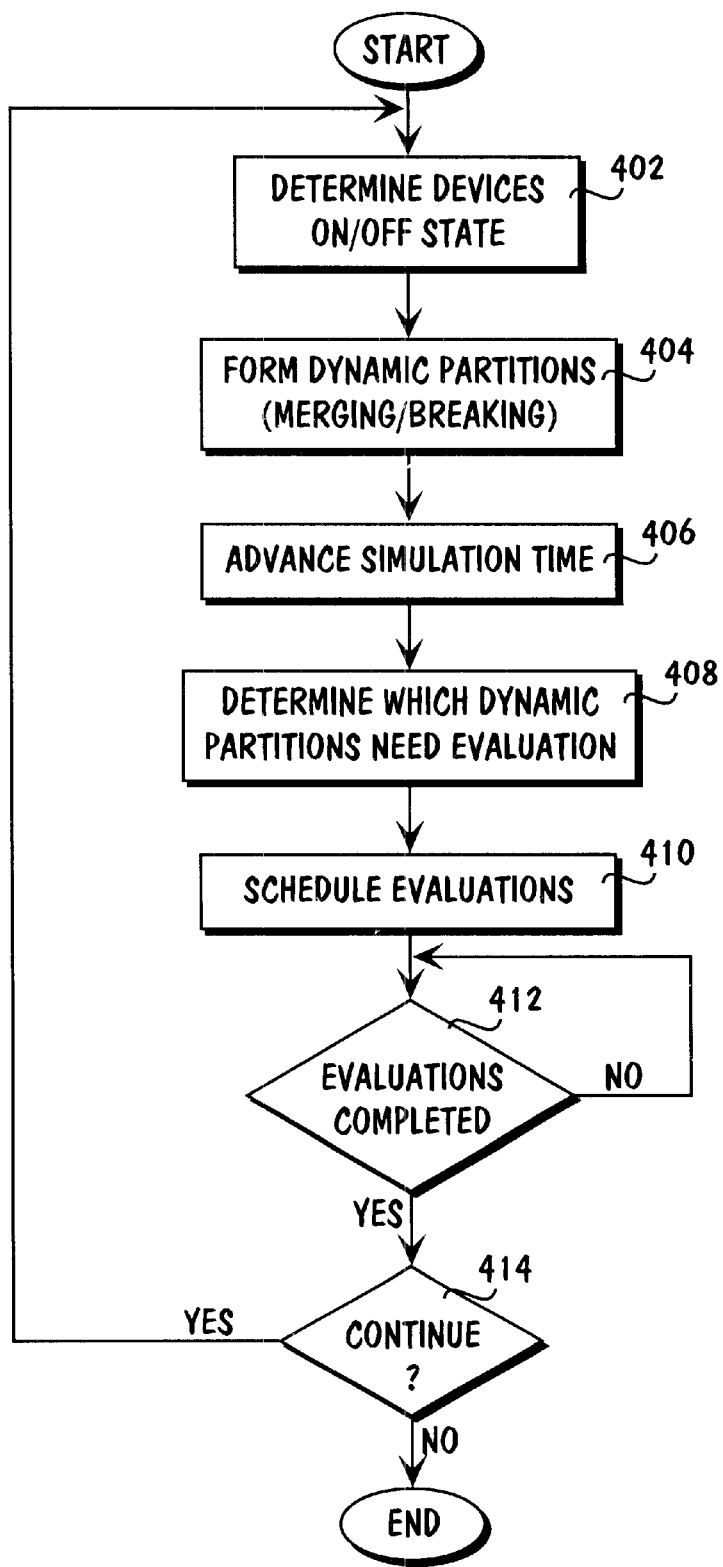
FIG. 4 illustrates the overall operation flow of the simulation engine of FIG. 1, in accordance with one embodiment.

Referring now to FIG. 4, wherein the operational flow of the simulation engine in general, in accordance with one embodiment, is illustrated. An overview of the operational flow will first be given, before selected ones of the operations are described in detail. As shown, at 402, dynamic partitioner 107 first determines the states of the various devices of the IC design, i.e. whether they are in an ON state or in an OFF state. In general, devices are considered to be ON or OFF, depending on the voltages on the terminals of the devices. (FIG. 17a–17d illustrate four specific example models or rules for determining whether devices of four device types are in the ON or the OFF state. Other models and rules may also be employed.) At 404, dynamic partitioner 107 forms dynamic partitions in accordance with whether the devices are in the ON or OFF state. That is, a dynamic partition is formed with nodes that are connected together through devices that are in the ON state. For the illustrated embodiment, by virtue of the way the static partitions are formed and pre-processed (ordered), dynamic partitioner 107 is able to form the dynamic partitions, referencing the static partitions, i.e. static partition by static partition. As a result, all dynamic partitions, if formed, are by default subsets of corresponding static partitions, thereby significantly streamlining the dynamic partition formation operation, and improving overall performance. Furthermore, once formed, each dynamic partition remains unchanged unless it is affected by devices going from OFF to ON or from ON to OFF, which too significantly streamlines the dynamic partition formation operation, and improves performance. When devices do go from OFF to ON or from ON to OFF, it is necessary to consider whether existing dynamic partitions should be merged or broken up. The dynamic partition formation process, including merging and breaking of dynamic partitions will be described more fully below, after the overall simulation strategy employing these dynamic partitions and on-demand evaluations have been described.

Continuing now to refer to FIG. 4, once the dynamic partitions have been formed, at 406, scheduler 109 advances the simulation time. At 408, scheduler 109 further determines which dynamic partitions, if any, need evaluation. At 410, scheduler 109 schedules only those dynamic partitions that require evaluations. In other words, under the present invention, node and device model evaluations are performed only on an as needed or on-demand basis. As a result, experience has shown, substantial improvement in simulation performance can be realized. Furthermore, as described earlier, when evaluations are performed, they are performed through matrix solution when accuracy is needed, thereby, allowing performance and accuracy to be achieved at the same time.

After all the necessary evaluations have been performed (accurately, if necessary), 412, scheduler 109 determines whether sufficient amount of simulation cycles have been applied, 414. If the desired number of simulation cycles have not been applied, the process returns to operation 402, where the device states are reassessed. Upon reassessment, the dynamic partitions are re-formed if necessary, which may include merging and/or breaking of existing dynamic partitions. Operations 402–414 are repeated as many times as it is necessary, until eventually, it is determined at 414, sufficient number of simulation cycles have been applied. At such time, the process terminates.

Returning back to operation 404, as described earlier, dynamic partitioner 107 forms dynamic partitions in accordance with whether the devices are in the ON or OFF state. A dynamic partition is formed with nodes that are connected together through devices that are in the ON state. For the illustrated embodiment, dynamic partitioner 107 forms the dynamic partitions referencing the static partitions, i.e. static partition by static partition. FIG. 5 illustrates the operational flow for forming dynamic partitions within a static partition, in accordance with one embodiment. As illustrated, at 502, dynamic partitioner 107 first sorts the nodes of each static partition according to the order established by static partitioner 103. At 504, dynamic partitioner 107 starts gathering up members of a dynamic partition, by starting tracing with the nodes in the lowest order. At 506, dynamic partitioner 107 determines if the north edge of the node is in the ON state. If it is "ON", the node is included in the dynamic partition being formed, 508. Then, the next higher order node is selected for examination, 510, and the process continues at 506. Operations 506–510 are repeated over and over again, until a "terminal" node is reached, i.e. a node without a north edge in the "ON" state. At such time, the process terminates. At this time, all "terminal" nodes and all nodes south of them have been included, forming a dynamic partition.

Figure 6B:
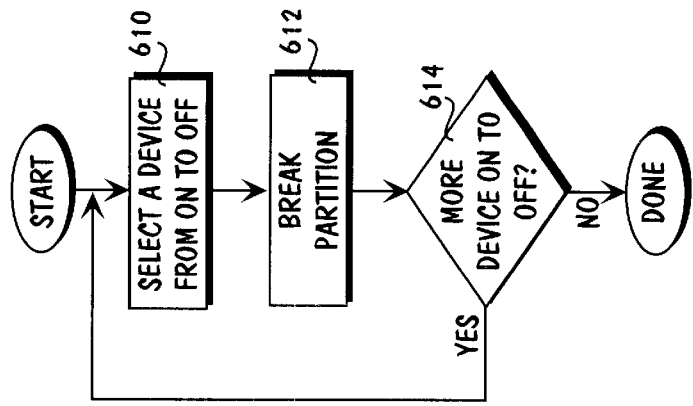
Figure 6A:
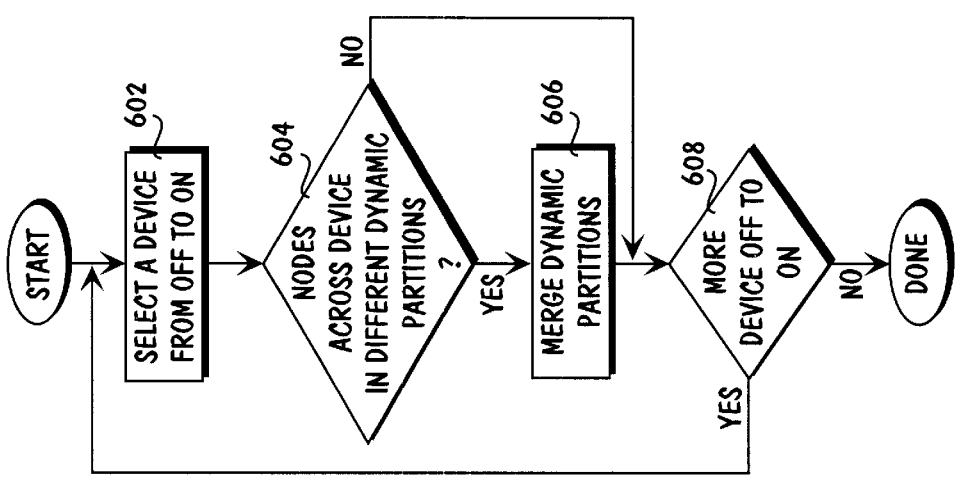
Figure 7:
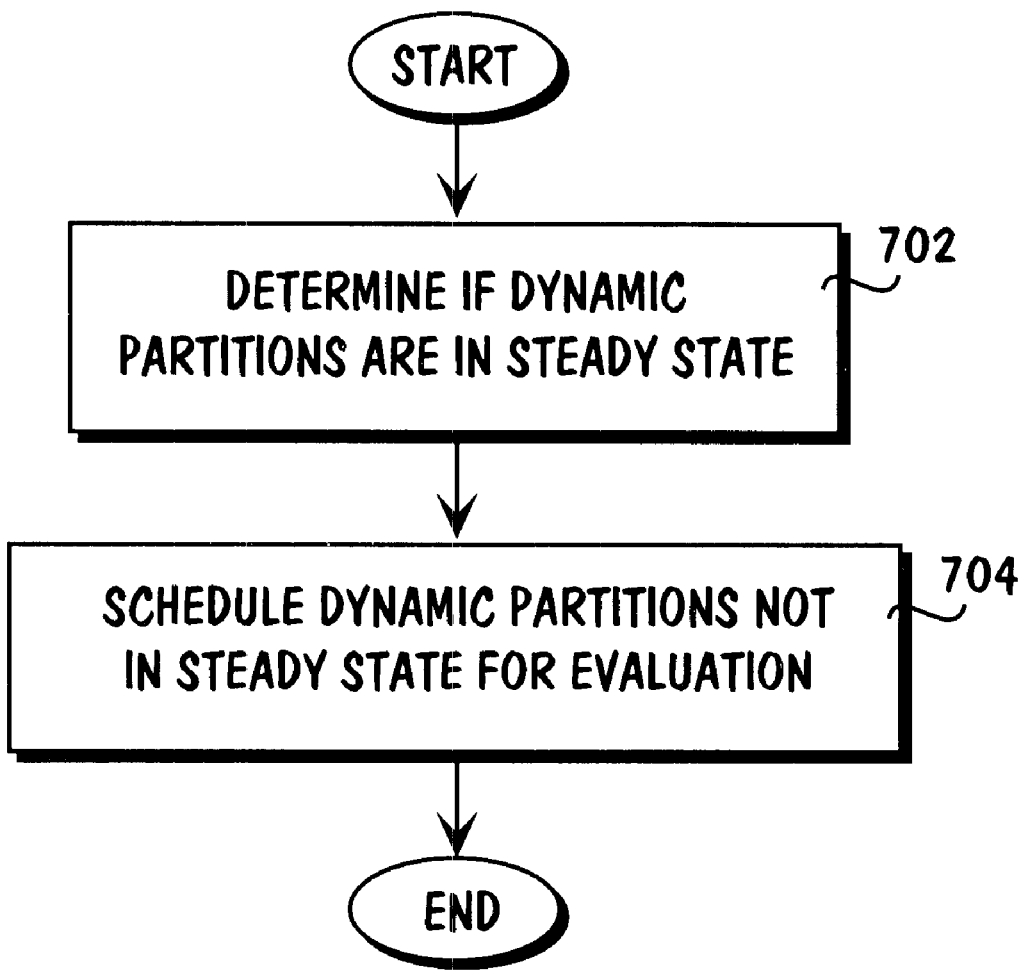
FIG. 7 illustrates the operation flow of the evaluation scheduler of FIG. 1, in accordance with one embodiment.
Figure 18A:
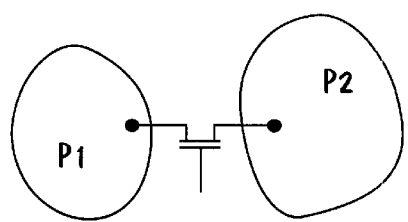
FIGS. 18a–18b illustrate one example each of merging and breaking dynamic partitions.

FIGS. 6a–6b illustrate the operation flows for merging two dynamic partitions and breaking a dynamic partition, in accordance with one embodiment each. As illustrated in FIG. 6a, for examining devices going from the OFF state to the ON state, dynamic partitioner 107 first selects one of these devices, i.e. one that went from the OFF state to the ON state, 602. Next, at 604, dynamic partitioner 107 determines if nodes across the device are located in different dynamic partitions (see e.g. FIG. 18a). If the nodes across the device are indeed located in different dynamic partitions, dynamic partitioner 107 merges the two dynamic partitions, 606. Otherwise, operation 606 is skipped. Upon merging the two dynamic partitions or skipping the operation, at 608, dynamic partitioner 107 determines if there are more "OFF to ON" devices to be examined. If so, the process continues at 602. Otherwise, the process terminates.

Figure 18B:
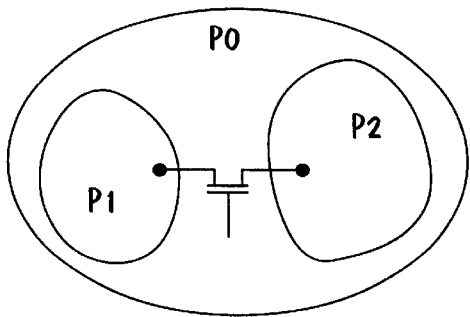

As illustrated in FIG. 6b, for examining devices going from the ON state to the OFF state, dynamic partitioner 107 first selects one of such devices, i.e. a device that went from the ON state to the OFF state, 610. Next, at 612, dynamic partitioner 107 breaks the dynamic partition into two dynamic partitions, splitting the original dynamic partition along where the device went from the ON state to the OFF state (see e.g. FIG. 18b). Upon breaking the dynamic partition, at 614, dynamic partitioner 107 determines if there are more "ON to OFF" devices to be examined. If so, the process continues at 610. Otherwise, the process terminates.

Figure 19:
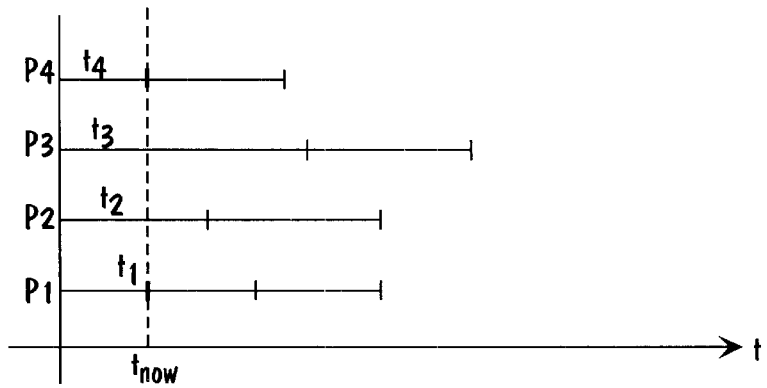
FIG. 19 illustrates the concept of simulation time step.

Returning now to operation 408 of FIG. 4, as described earlier, scheduler 109 determines which dynamic partitions, if any, need evaluation. For the illustrated embodiment, first and foremost, dynamic partitions are eligible to be considered for evaluation if and only if their simulation time steps are "in sync" with the current simulation time step (see e.g. FIG. 19). The simulation time step of each dynamic partition is independent of each other. The simulation time step of each dynamic partition is determined based on the requirements imposed by the devices and nodes in the dynamic partitions, as well as the signals that affect the dynamic partitions. For example, the rate at which voltage changes on a node determines the time-step for the partition. Usually, the time-step chosen for the dynamic partition is the smallest time-step determined from each node in the dynamic partition. The independent treatment of the simulation time steps is another factor that contributes to the improved performance of the simulation tool of the present invention, without sacrificing accuracy. Since at each simulation time step, not all dynamic partitions have to be examined, smaller simulation time steps may actually be employed to improve accuracy in one dynamic partition, but without incurring performance cost since the other dynamic partitions can continue to choose larger time steps.

Additionally, evaluation for one of these dynamic partitions is deemed necessary only if the dynamic partition is not in steady state, When a dynamic partition is considered not in steady state, it is also referred to as in evaluation state. This is another factor that contributes to the improvement of performance of the simulation tool of the present invention, without sacrificing accuracy. For the illustrated embodiment, scheduler 109 employs a number of decision rules to determine whether one of these dynamic partitions should be considered in steady state, and therefore no evaluation is necessary.

These decision rules include:
a) a dynamic partition enters steady state when none of the nodes in the dynamic partition changes by more than a pre-set value;
b) a dynamic partition cannot enter steady state if the gate nodes of any device in the dynamic partition is changing due a user defined input;
c) a dynamic partition in steady state cannot go to steady state after one evaluation (to prevent a zero-delay loop from being formed, to be explained more fully below);
d) as long as the input signals or the nodes of a dynamic partition are changing, the dynamic partition is to be evaluated.

Furthermore, when a node changes voltage, scheduler 109 determines whether any dynamic partitions that are adjacent to the node need to be evaluated. To make the determination, all devices whose gate is connected to the node are traversed. If the device is in the OFF state, and the new state of this device is determined to be the ON state, then evaluations for the dynamic partitions on the drain and source nodes of this device will be deemed necessary. If these dynamic partitions are in steady state, they will be changed to evaluation state and scheduled for evaluation. If these dynamic partitions are already in the evaluating state, then consideration is given on whether the simulation time step of these dynamic partitions should be reduced. The simulation time step is reduced when the gate node changes rapidly. However, if it is determined that the gate node change is not rapid enough, the time step is left unchanged. If the new state of the device, however, is the same OFF state, then no action is taken. If the device is in the ON state and the new state is the OFF state, then also no action is taken. If the new state is the ON state, then the same rules as in the OFF to ON transition are applied.

Figure 20:
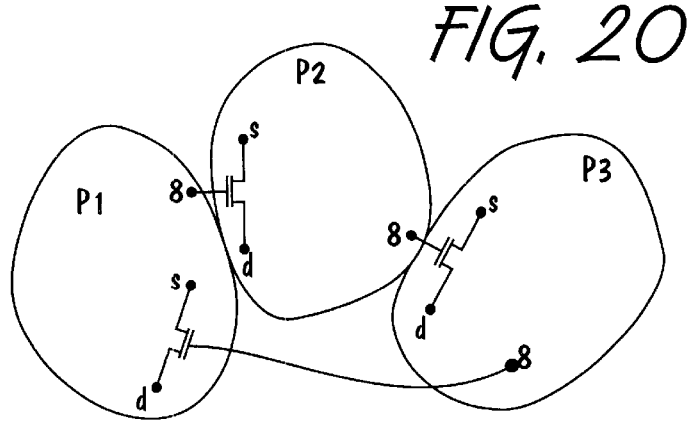
FIG. 20 illustrates the phenomenon of zero-delay trigger loop.

Turning now to the topic of zero-delay trigger loop. A zero-delay trigger loop is formed when a loop of dynamic partitions are triggered for evaluation (see FIG. 20). Since all the dynamic partitions involved in such a loop are being evaluated, the zero-delay loop can exist only if at least one of the dynamic partitions in the loop is not in the evaluating state. That is, there must exist at least one dynamic partition that transitions from the steady state to the evaluating state and back to the steady state after one evaluation in order for a zero-delay loop to sustain itself. The way to prevent it from happening is to prevent a dynamic partition that was in the steady state and moved to the evaluating state for evaluation, from going to steady state after one evaluation. Thus, for the illustrated embodiment, it is made impossible for a dynamic partition to go from steady state to evaluating state and then immediately to steady state. Since the transition from steady state to evaluating state can happen with zero-delay, but the transition from evaluating state to steady state cannot happen with zero-delay, triggering of zero-delay loop is thereby prevented.

Returning now to operation 410 of FIG. 4, wherein dynamic partitions requiring evaluation are scheduled. For the illustrated embodiment, accuracy of the evaluations are ensured by carefully choosing the time when the evaluations are performed for certain cases. In the case where the gate node of a device that is in the OFF state, and undergoing a voltage change that will cause the device to go to the ON state, the evaluation of the dynamic partition in which this device belongs is "triggered" immediately, at the present time. This "triggering" for evaluation happens with zero-delay, ensuring accuracy. It is important to note that without the ability to prevent zero-delay loops, such zero-delay triggers would not be possible, thus resulting in significant loss of accuracy. In another case, where a long chain of inverters, all of which are at a steady state voltage, when the input of the first inverter changes, the zero-delay triggering causes all the inverters to be evaluated at this time. Even a small delay in the triggering will cause the inverters at the end of the chain to be evaluated significantly late, thus leading to significant inaccuracy.

Returning now to operation 412 of FIG. 4, wherein the dynamic partitions scheduled for evaluations are evaluated. In general, all nodes in a dynamic partition to be evaluated are inserted in a stack in the order they appear in the dynamic partition from root to leaf. Once inserted in the evaluation stack, the nodes in the stack are evaluated in the order from leaf to root in sequence. In this bottom-up traversal of the nodes, the Gaussian Elimination step of a matrix solution is performed. Once the root node has been reached, the traversal is reversed. From the root, a top-down traversal of the nodes performing the forward substitution step of a matrix solution is performed. At the end of this top-down traversal, the solution is available. As alluded to earlier, in selected ones of the model evaluations, some of the evaluations are performed adaptively, which is described in detail in the incorporated by reference patent application.

Figure 8:
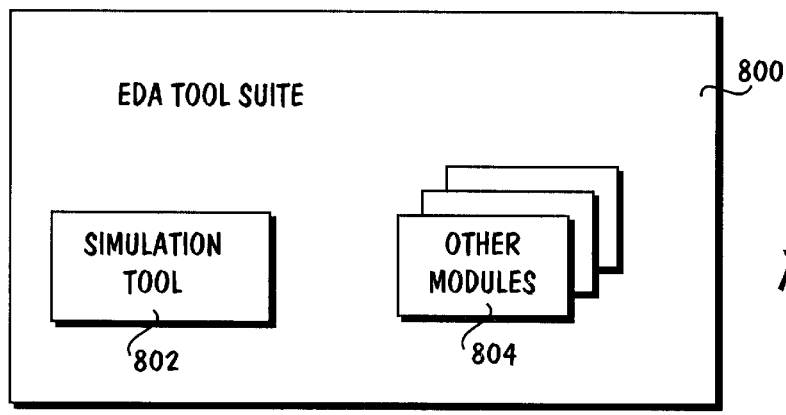
FIG. 8 illustrates an example EDA tool incorporated with the circuit simulator of the present invention, in accordance with one embodiment.

Referring now to FIG. 8, wherein an EDA tool incorporated with the circuit simulator of the present invention in accordance with one embodiment is shown. As illustrated, EDA tool suite 800 includes circuit simulator 802 incorporated with the teachings of the present invention as described earlier with references to the various figures. Additionally, EDA tool suite 800 includes other tool modules 804. Examples of these other tool modules 802 include but not limited to synthesis module, layout verification module and so forth.

Figure 9:
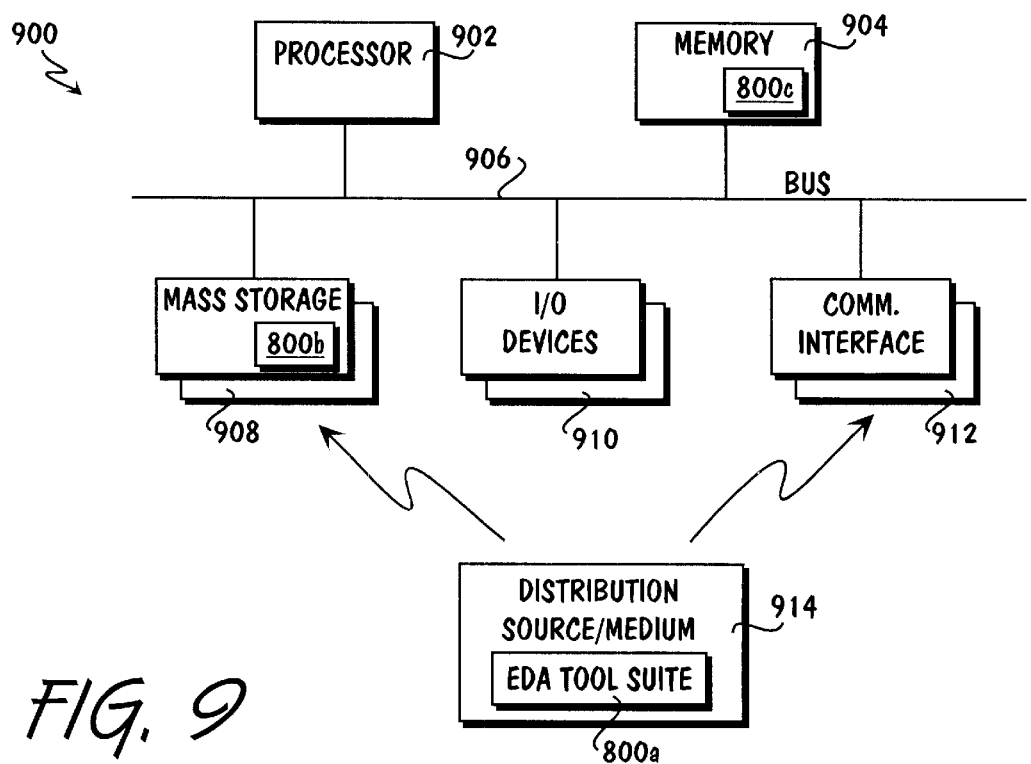
FIG. 9 illustrates an example computer system suitable to be programmed with the programming instructions implementing the EDA tool of FIG. 8.
Figure 10:
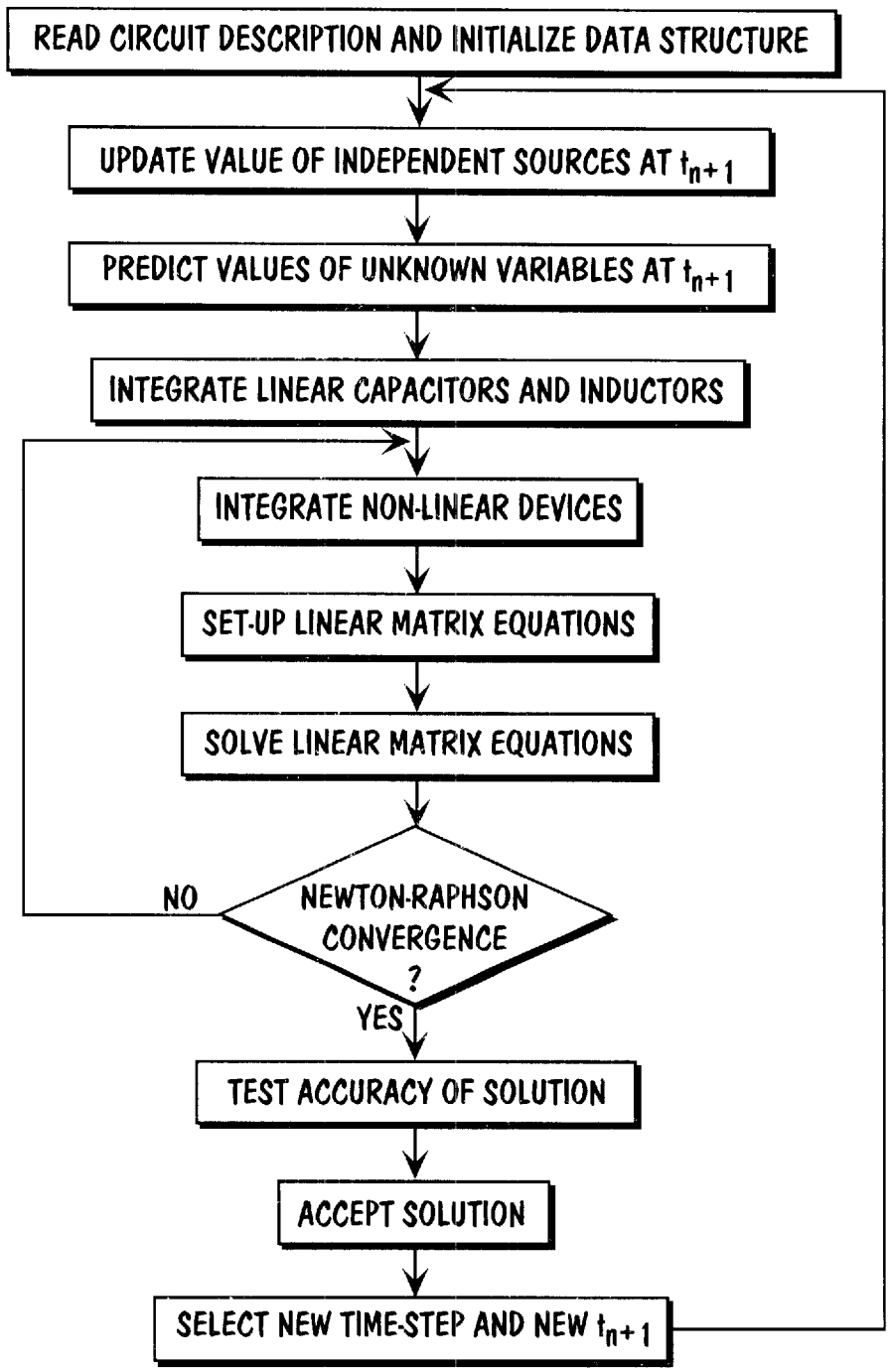
FIG. 10 illustrates a prior art approach to circuit simulation.
Figure 17A:
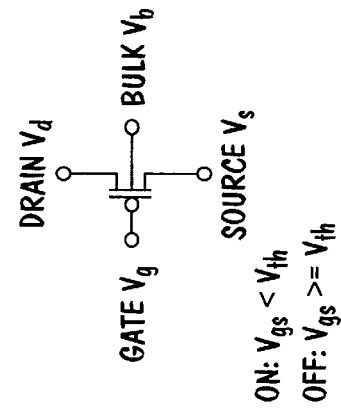
FIGS. 17a–17d illustrate four example device ON/OFF determinations.
Figure 17B:
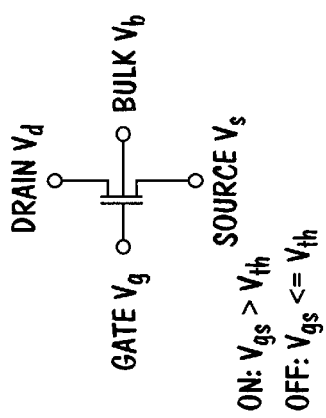
Figure 17C:
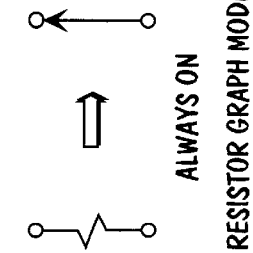
Figure 17D:
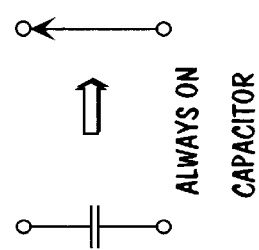

FIG. 9 illustrates one embodiment of a computer system suitable for use to practice the present invention. As shown, computer system 900 includes processor 902 and memory 904 coupled to each other via system bus 906. Coupled to system bus 906 are non-volatile mass storage 908, such as hard disks, floppy disk, and so forth, input/output devices 910, such as keyboard, displays, and so forth, and communication interfaces 912, such as modem, LAN interfaces, and so forth. Each of these elements performs its conventional functions known in the art. In particular, system memory 904 and non-volatile mass storage 908 are employed to store a working copy and a permanent copy of the programming instructions implementing the above described teachings of the present invention. System memory 904 and non-volatile mass storage 906 may also be employed to store the IC designs. The permanent copy of the programming instructions to practice the present invention may be loaded into non-volatile mass storage 908 in the factory, or in the field, using distribution source/medium 914 and optionally, communication interfaces 912. Examples of distribution medium 914 include recordable medium such as tapes, CDROM, DVD, and so forth. In one embodiment, the programming instructions are part of a collection of programming instructions implementing EDA tool 800 of FIG. 8. The constitution of elements 902–914 are well known, and accordingly will not be further described.

In general, those skilled in the art will recognize that the present invention is not limited to the embodiments described. Instead, the present invention can be practiced with modifications and alterations within the spirit and scope of the appended claims. The description is thus to be regarded as illustrative, instead of restrictive on the present invention.

Thus, a circuit simulator for simulating an IC design has been described.

What is claimed is:

1. A computer implemented method for simulating a circuit, the method comprising:
    preprocessing sets of nodes, each set comprising one of a plurality of static partitions of the circuit, to determine an order for the nodes in each set that is particularly suited for dynamic partitioning of a respective static partition; and
    forming a plurality of dynamic partitions of the circuit by traversing each of the sets of nodes in the respective order and gathering active sets of nodes.

2. The method of claim 1, wherein the method further comprises pre-forming said static partitions.

3. The method of claim 2, wherein pre-forming the static partitions comprises organizing devices of the circuit into connected sets, with each connected set forming a static partition.

4. The method of claim 1, wherein preprocessing the sets of nodes is performed at least in accordance with signal flow.

5. The method of claim 1, wherein preprocessing the sets of nodes is performed at least in accordance with where strongly connected components are located.

6. The method of claim 1, wherein preprocessing the sets of nodes comprises:
    generating a graphic representation of each of the plurality of static partitions; and
    ordering nodes and edges in each of the graphic representations.

7. The method of claim 6, wherein ordering the nodes and edges in each of the graphic representations comprises:
    identifying bi-connected components in each of the graphic representations; and
    ordering the nodes and edges based on the identified bi-connected components.

8. The method of claim 1, wherein gathering the active sets of nodes comprises identifying devices that are ON in a given static partition, and identifying nodes in a graphical representation of the given static partition that are connected by the devices that are ON, with each interconnected collection of nodes that are ON forming one of the plurality of dynamic partitions.

9. The method of claim 1, wherein forming the plurality of dynamic partitions further comprises merging and/or breaking previously formed dynamic partitions.

10. The article of manufacture comprising:
    a recordable medium having stored therein a plurality of programming instructions to be executed by a processor, wherein when executed, causes the method as set forth in claim 1 to be performed.

11. The article of claim 10, wherein the programming instructions, when executed, further causes the additional operations set forth in claim 9 to be performed.

12. The method of claim 1 further comprising:
    at each simulation time step, determining which of the plurality of dynamic partitions has to be evaluated, and evaluating only the dynamic partitions that require evaluation.

13. The method of claim 12, wherein determining which of the plurality of dynamic partitions has to be evaluated comprises determining whether a given dynamic partition is in steady state.

14. The method of claim 12, wherein determining which of the plurality of dynamic partitions has to be evaluated comprises preventing a zero-delay trigger loop from being formed.

15. The method of claim 12, wherein evaluating the dynamic partitions that require evaluation comprises traversing a graphical representation of a given dynamic partition in an bottom-up manner, and computing a matrix solution for each node of the graphical representation.

16. A computer implemented method for simulating a circuit, the method comprising:
    forming a plurality of dynamic partitions of the circuit, using a plurality of pre-formed static partitions of said circuit;
    at each simulation time step, determining whether the dynamic partitions have to be evaluated, and evaluating only the dynamic partitions that require evaluation, wherein said determination of whether a dynamic partition has to be evaluated comprises determining whether a dynamic partition is in steady state, and, wherein said determination of whether a dynamic partition has to be evaluated further comprises preventing a zero-delay trigger loop from being formed.

17. An article of manufacture comprising:
    a recordable medium having stored therein a plurality of programming instructions to be executed by a processor, wherein when executed, implement a method comprising:
        forming a plurality of dynamic partitions of the circuit, using a plurality of pre-formed static partitions of said circuit;
        at each simulation time step, determining whether the dynamic partitions have to be evaluated, and evaluating only the dynamic partitions that require evaluation, wherein said determination of whether a dynamic partition has to be evaluated comprises determining whether a dynamic partition is in steady state, and, wherein said determination of whether a dynamic partition has to be evaluated further comprises preventing a zero-delay trigger loop from being formed.

18. A computer system comprising:
   a storage medium having stored therein a plurality of programming instructions implementing a circuit simulator to simulate a circuit, the circuit simulator including
      a static partitioner to preprocess sets of nodes, each set comprising one of a plurality of static partitions of the circuit, to determine an order for the nodes in each set that is particularly suited for dynamic partitioning of a respective static partition; and
      a dynamic partitioner to form a plurality of dynamic partitions of the circuit by traversing each of the sets of nodes in the respective order and gathering active sets of nodes; and
   a processor coupled to the storage medium to execute the programming instructions to operate the circuit simulator.

19. The computer system of claim 18, wherein said static partitioner is further to pre-form said plurality of static partitions.

20. The computer system of claim 18, wherein said dynamic partitioner gathers the active sets of nodes by identifying devices that are ON in a given static partition, and identifying nodes in a graphical representation of the given static partition that are connected by the devices that are ON, with each interconnected collection of nodes that are ON forming one of the plurality of dynamic partitions.

21. The computer system of claim 18 wherein the circuit simulator further comprises:
   an evaluation scheduler to determine, at each simulation time step, which of the plurality of dynamic partitions has to be evaluated, and to evaluate only the dynamic partitions that require evaluation.

22. The computer system of claim 21 wherein the circuit simulator further comprises:
   node and model evaluators to evaluate a given dynamic partition requiring evaluation by traversing a graphical representation of a given dynamic partition in an bottom-up manner, and computing a matrix solution for each node of the graphical representation.

23. A method for evaluating a dynamic partition of a circuit to simulate the circuit, the method comprising:
   preprocessing sets of nodes, each set comprising one of a plurality of static partitions of the circuit, to determine an order for the nodes in each set that is particularly suited for dynamic partitioning of a respective static partition;
   during simulation, forming dynamic partitions by traversing each of the sets of nodes in the respective order and gathering active sets of nodes; and
   evaluating selected ones of the dynamic partitions formed, with each selected dynamic partition being evaluated in an ordered manner through a matrix solution.

24. The method of claim 23, wherein evaluating each of the selected dynamic partitions is performed on-demand, on an as needed basis.

25. A computer system comprising:
   a storage medium having stored therein a plurality of programming instructions; and
   a processor coupled to the storage medium to execute the programming instructions to:
      preprocess sets of nodes, each set comprising one of a plurality of static partitions of a simulated circuit, to determine an order for the nodes in each set that is particularly suited for dynamic partitioning of a respective static partition,
      during simulation, form dynamic partitions by traversing each of the sets of nodes in the respective order and gather active sets of nodes, and
      evaluate selected ones of the dynamic partitions formed, with each selected dynamic partition being evaluated in an ordered manner through a matrix solution.

26. The computer system of claim 25, wherein the processor further executes the programming instructions to evaluate the dynamic partitions on-demand, on an as needed basis.

* * * * *